United States Patent
Parida

(10) Patent No.: US 10,028,410 B2
(45) Date of Patent: Jul. 17, 2018

(54) COLD PLATE WITH COMBINED INCLINED IMPINGEMENT AND RIBBED CHANNELS

(71) Applicant: INTERNATIONAL BUSINESS MACHINES CORPORATION, Armonk, NY (US)

(72) Inventor: Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 14/716,329

(22) Filed: May 19, 2015

(65) Prior Publication Data

US 2015/0258645 A1 Sep. 17, 2015

Related U.S. Application Data

(62) Division of application No. 13/415,266, filed on Mar. 8, 2012, now Pat. No. 9,219,022.

(51) Int. Cl.
*F28F 3/02* (2006.01)
*F28F 3/04* (2006.01)
(Continued)

(52) U.S. Cl.
CPC .......... *H05K 7/20254* (2013.01); *B23P 15/26* (2013.01); *H01L 23/4735* (2013.01); *H05K 7/20218* (2013.01); *H05K 7/20263* (2013.01); *F28F 3/02* (2013.01); *F28F 3/048* (2013.01); *F28F 13/02* (2013.01); *F28F 2215/10* (2013.01); *H01L 23/467* (2013.01); *H01L 2924/00* (2013.01); *H01L 2924/0002* (2013.01);
(Continued)

(58) Field of Classification Search
CPC .......... H05K 7/20254; H05K 7/20263; H05K 7/20218; H01L 23/4735; H01L 2924/00; H01L 2924/0002; H01L 23/467; B23P 15/26; Y10T 29/4935; Y10T 29/49359; F28F 3/048; F28F 3/02; F28F 13/02; F28F 2215/10
USPC ...... 29/890.03, 890.035; 361/699, 702, 703; 165/80.3, 80.4, 185, 908, 109.1
See application file for complete search history.

(56) References Cited

U.S. PATENT DOCUMENTS 3,163,207 A * 12/1964 Schultz ............... H01L 23/4006
165/185
3,455,376 A 7/1969 Beurtheret
(Continued)

OTHER PUBLICATIONS

Office Action for U.S. Appl. No. 14/862,793 dated Apr. 26, 2017 (11 pages).

(Continued)

*Primary Examiner* — Bayan Salone
(74) *Attorney, Agent, or Firm* — Tutunjian & Bitetto, P.C.; Daniel P. Morris

(57) ABSTRACT

Heat transfer devices and methods for making the same that include a first enclosure having at least one inlet port; a second enclosure having a bottom plate and one or more dividing walls to establish channels, at least one internal surface of each channel having rib structures to create turbulence in a fluid flow; and a jet plate connecting the first enclosure and the second enclosure having impinging jets that convey fluid from the first enclosure to the channels, said impinging jets being set at an angular deviation from normal to cause local acceleration of fluid and to increase a local heat transfer rate.

16 Claims, 8 Drawing Sheets

(51) Int. Cl.
*F28F 13/02* (2006.01)
*B23P 15/26* (2006.01)
*H01L 23/46* (2006.01)
*H05K 7/20* (2006.01)
*H01L 23/473* (2006.01)
*H01L 23/467* (2006.01)

(52) U.S. Cl.
CPC ...... *Y10T 29/4935* (2015.01); *Y10T 29/49359* (2015.01)

(56) References Cited

U.S. PATENT DOCUMENTS

| | | | | |
|---|---|---|---|---|
| 5,040,596 | A * | 8/1991 | Terasaki | F28D 9/0062 165/166 |
| 5,304,845 | A * | 4/1994 | Lindquist | H01L 23/467 165/80.3 |
| 5,472,316 | A * | 12/1995 | Taslim | F01D 5/187 416/96 R |
| 5,522,452 | A * | 6/1996 | Mizuno | H01L 23/427 165/104.33 |
| 5,576,932 | A * | 11/1996 | Bishop | H01L 23/467 165/80.3 |
| 6,058,010 | A | 5/2000 | Schmidt et al. | |
| 6,736,192 | B2 * | 5/2004 | Chang | F28F 13/02 165/47 |
| 6,781,834 | B2 * | 8/2004 | Nair | H01L 23/467 165/121 |
| 7,201,217 | B2 * | 4/2007 | Johnson | H05K 7/20254 165/170 |
| 7,509,995 | B2 * | 3/2009 | Bhatti | F28D 15/0233 165/80.3 |
| 7,916,481 | B2 * | 3/2011 | Thome | H01L 23/4735 165/104.33 |
| 7,992,626 | B1 * | 8/2011 | Tilton | F28F 13/185 165/104.26 |
| 8,047,044 | B2 * | 11/2011 | Goldman | F28F 13/12 165/170 |
| 8,659,896 | B2 | 2/2014 | Dede et al. | |
| 9,219,022 | B2 * | 12/2015 | Parida | H01L 23/4735 |
| 2002/0117291 | A1 * | 8/2002 | Cheon | G06F 1/20 165/80.4 |
| 2005/0180104 | A1 | 8/2005 | Olesen et al. | |
| 2007/0272392 | A1 * | 11/2007 | Ghosh | H01L 23/4336 165/80.4 |
| 2009/0260789 | A1 * | 10/2009 | Sperandei | F28D 1/0333 165/177 |
| 2009/0314467 | A1 * | 12/2009 | Campbell | H01L 23/4735 165/80.4 |
| 2009/0321046 | A1 * | 12/2009 | Hernon | F28F 13/02 165/80.3 |
| 2012/0325436 | A1 | 12/2012 | Shedd | |

OTHER PUBLICATIONS

Final Office Action for U.S. Appl. No. 14/862,793 dated Jan. 26, 2018 (16 pages).

* cited by examiner

COLD PLATE WITH COMBINED INCLINED IMPINGEMENT AND RIBBED CHANNELS

RELATED APPLICATION INFORMATION

This application is a Divisional of application Ser. No. 13/415,266, filed Mar. 8, 2012, incorporated herein by reference in its entirety.

GOVERNMENT RIGHTS

This invention was made with Government support under Contract No.: DE-EE0002894 (Department of Energy). The government has certain rights in this invention.

BACKGROUND

Technical Field

The present invention relates to cooling and, more particularly, to cooling devices that use inclined impingement of coolant fluid into ribbed channels.

Description of the Related Art

The demand for increased power and performance in semiconductor devices grows constantly. Meeting that demand produces an increased amount of heat, and therefore also increases the need for effective heat dissipation. While conventional cooling solutions have worked on the devices of the past, no straightforward extension of those principles has been found for high heat fluxes in the smaller and more efficient electronic devices that present fabrication technologies are capable of producing. In particular, the air-cooled heatsinks of the past are ineffective in addressing the cooling needs of modern devices.

A number of alternative cooling solutions have been proposed, including liquid-based systems that pump liquid coolant across a heat dissipation apparatus. However, there are practical limitations to the efficiency of such devices when implemented at small scale. Improved cooling would allow for the use of higher-power devices and would enable an increase in the practical computing capacity of devices in many fields of technology.

SUMMARY

A heat transfer device is shown that includes a first enclosure that has at least one inlet port; a second enclosure that has a bottom plate and one or more dividing walls to establish a plurality of channels, at least one internal surface of each channel having a plurality of rib structures to create turbulence in a fluid flow; and a jet plate connecting the first enclosure and the second enclosure having a plurality of impinging jets that convey fluid from the first enclosure to the plurality of channels, said impinging jets being set at an angular deviation from normal to cause local acceleration of fluid and to increase a local heat transfer rate.

A heat transfer device is shown that includes a first enclosure to accept and collect fluid input that has at least one inlet port to introduce a fluid flow; a second enclosure that has a bottom plate and one or more dividing walls to establish a plurality of channels, at least one internal surface of each channel having a plurality of rib structures to create turbulence in a fluid flow, wherein the second enclosure is disposed below the first enclosure and offset such that the inlet port is laterally displaced from the plurality of channels; and a jet plate connecting the first enclosure and the second enclosure having a plurality of impinging jets that convey fluid from the first enclosure to the plurality of channels, said impinging jets being set at an angular deviation from normal to cause local acceleration of fluid and to increase a local heat transfer rate.

A heat transfer device is shown that includes a first enclosure to accept and collect fluid input that has at least one inlet port in the center of a top surface of the enclosure to introduce a fluid flow; a second enclosure that has a bottom plate and one or more dividing walls to establish a plurality of channels, at least one internal surface of each channel having a plurality of rib structures to create turbulence in a fluid flow, wherein the second enclosure is disposed below the first enclosure and centered below the inlet port; and a jet plate connecting the first enclosure and the second enclosure having a plurality of impinging jets that convey fluid from the first enclosure to the plurality of channels, said impinging jets being set at an angular deviation from normal to cause local acceleration of fluid and to increase a local heat transfer rate.

A method for forming a cooling device is shown that includes forming a top cover plate with at least one inlet port; forming a jet plate with a plurality of inclined jets set at an angular deviation from normal; forming a bottom plate with channel walls that have ribs; attaching the top cover plate to the jet plate to form an inlet plenum; and attaching the jet plate to the bottom plate to form a plurality of ribbed channels.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles combine inclined impingement of coolant with ribbed cooling channels to produce a cold plate for high heat flux applications. The present embodiments use an array of impinging jets to provide high local heat transfer rates and, furthermore, provide an increased wetted surface area and increase flow turbulence along cooling channels with ribs, thereby increasing the overall heat transfer rates by exploiting efficiencies that result from particular kinds of coolant motion. When flow is turbulent, coolant particles exhibit additional transverse motion. This enhances the rate of energy and momentum exchange between coolant particles, thus increasing the heat transfer coefficient and increasing the cooling effect. This improves on conventional single-phase cooling systems, which do not concern themselves with coolant flow at such a minute level.

Although it is specifically contemplated that the present principles may be applied to fields of technology such as cooling for microprocessors and other electronic/semiconductor devices, the present principles may be applied to a broad range of devices. In particular, coolers made according to the principles described herein may be used in, e.g., industrial, automotive, and home appliance applications to more effectively dissipate waste heat. Any application that uses "active" cooling, where coolant is pumped across a heat dissipating surface, can benefit from implementing the present principles.

Figure 1:
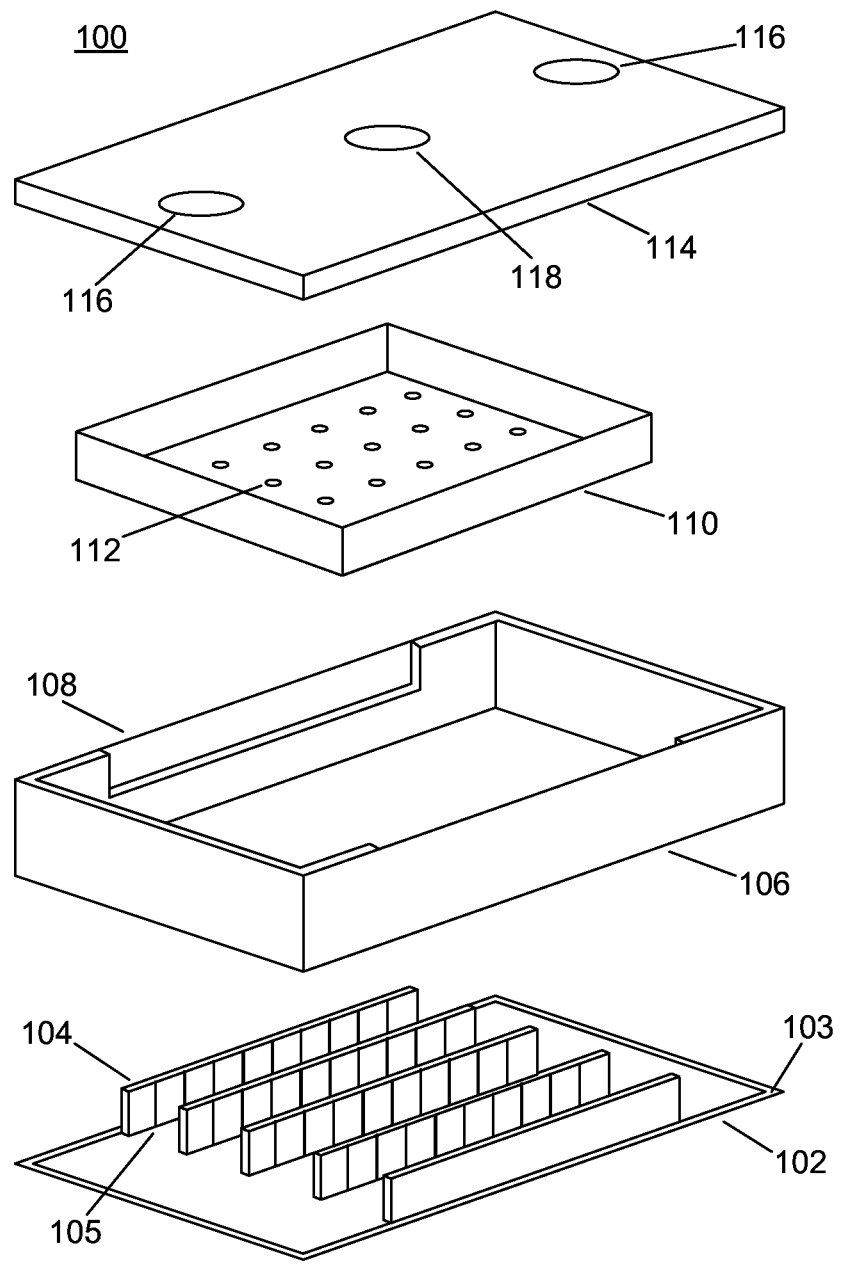
FIG. 1 is an exploded view of an embodiment of a cooling device in accordance with the present principles.

Referring now to the drawings in which like numerals represent the same or similar elements and initially to FIG. 1, an exemplary exploded diagram of a cold plate 100 according to the present principles is shown. A bottom channel plate 102 is shown having an inset border 103. The bottom plate 102 has a set of channel walls 104, said walls having ribs 105 along their length. Alternatively, the walls 104 may be formed on a separate plate and then joined to the bottom plate 102. The bottom channel plate 102 can be fabricated using any appropriate method or combination of methods, including milling, electrical discharge machining, etching, stamping, extrusion, and skiving. The bottom channel plate 102 should be formed from a material having a high thermal conductivity, such as copper, to promote efficient heat transfer from the device to be cooled into the coolant fluid.

A hollow side cover block 106 fits over the recessed border 103 of bottom channel plate 102. The hollow side cover block 106 forms a tight seal with the bottom channel plate 102, and may be joined using any appropriate method or combination of methods, including brazing, soldering, and direct-bonding. The hollow side cover block 106 may be formed from the same material as the bottom channel plate 102 or may be formed from another material. Because coolant will still come into contact with the hollow side cover block 106, the thermal transfer properties of the hollow side cover block 106 are relevant. The hollow side cover block 106 may be formed from any appropriate method, for example extrusion. The hollow side cover block 106 includes inset portions 108 to receive a jet plate 110.

The jet plate 110 may be formed from any appropriate material. The jet plate 110 will not come into contact with the bottom channel plate 102, but will contact channel walls 104, such that its thermal properties will still be relevant. On the other hand, the jet plate 110 forms a border between input coolant and output coolant. A material with a lower thermal conductivity may therefore be selected, trading off heat transfer from the channel walls 104 for superior insulation between warm outlet coolant and cold input coolant.

The jet plate 110 fits into hollow side cover block 106 and joins with the channel walls 104, forming channels with rectangular cross sections. Alternative cross sections may be formed based on the disposition of the channel walls 104. It is specifically contemplated that quadrilateral cross-sections will be used, but other shapes may also be employed, such as triangles. The bottom surface of jet plate 110 has rows of inclined jet ports 112, which open into the channels formed by the jet plate 110 and the bottom channel plate 102.

A top cover plate 114 fits onto the hollow side cover block 106 and the jet plate 110, forming an inlet plenum. The top plate 114 may be formed of any appropriate material. In particular, the top plate 114 may be formed from materials similar to those employed in other components, or may be formed from a material having less thermal conductivity. A material with lower thermal conductivity is advantageous in the top plate 114, as such a material provides superior insulation between warm outlet coolant and cold input coolant, as well as inhibiting the infiltration of ambient heat from the environment. The top cover plate has outlet ports 116 and an inlet port 118. The number and particular positioning of outlet and inlet ports 116 and 118 may be altered according to the needs of the particular application.

Coolant may be introduced and removed from cold plate 100 using any appropriate form of pump. The coolant may then be run through a larger heat-dissipation unit, e.g., a heat sink (not shown), reducing the temperature. This allows coolant to be recycled through the cold plate 100 in a closed system.

Figure 2:
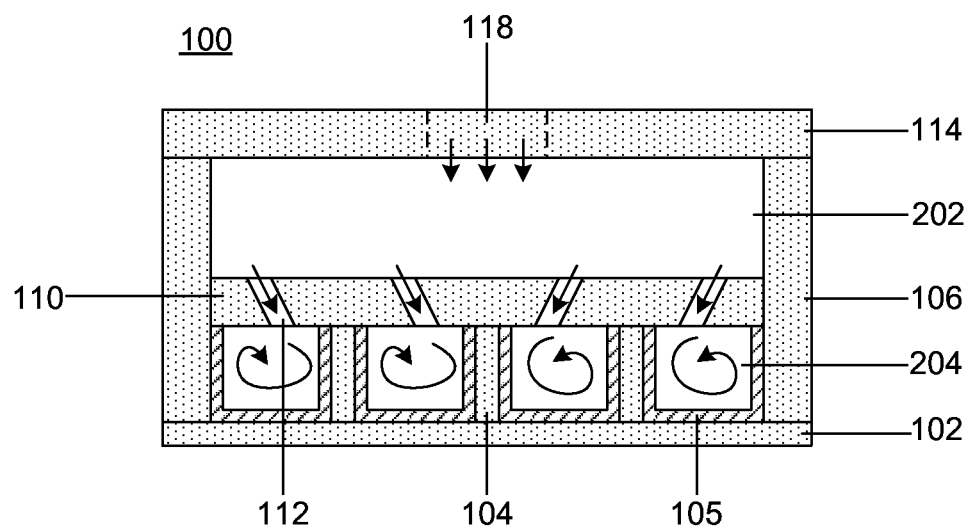
FIG. 2 is a cut-away view of an embodiment of a cooling device, providing a cross-sectional view of cooling channels, in accordance with the present principles.

Referring now to FIG. 2, a cut-away view of an assembled cold plate 100 is shown, illustrating coolant circulation. The coolant may be any suitable material, including air, water, and oil. Exemplary coolants include deionized water, propylene glycol, and mineral oil. The coolant material should be chosen keeping in mind the constituent materials of cold plate 100, to prevent chemical reactions or degradation from occurring. An advantageous coolant will have a high thermal conductivity, high thermal capacity, and low viscosity. Coolant, illustrated by arrows, enters plenum 202 through inlet hole 118. The inclined jet holes 112 are shown in jet plate 110, guiding coolant into channels 204 at an angle, causing coolant to circulate within the channels 204. This angle is directed perpendicular to the flow of coolant through the channels 204, producing circulatory turbulence.

The entrance effect in the inclined jets 112 causes local acceleration of the coolant jets and increases thereby the local heat transfer rates as compared to a normally impinging jet 112 in a combined environment. This effect is partially due to an increased coolant velocity transverse to the channel direction, such that any given quantity of coolant will come into contact with more of the internal surface area of channel 204. The vortex that results in the coolant is significantly more effective in transferring heat away from the surface of channels 204 than would result with a normally impinging jet 112, and it is clear that additional turbulence increases the heat transfer rate further.

The number of jets 112, jet impingement angle, jet diameter, jet location, and jet orientation may be determined according to the needs of the particular application. Some exemplary impingement angles include 20, 30, and 45 degrees with respect to the normal. It should be recognized that any impingement angle may be used, although too large of an angle will impede coolant flow. An exemplary diameter for jets 112 could be about 1 mm, and the jet 112 could be oriented to impinge upon either of the channels' 204 sidewalls or upon the channel's base.

It should also be recognized that the jets 112 may have any appropriate cross-sectional shape. Although it is specifically contemplated that the jets 112 may have a circular cross-section, other shapes may also be employed, including square and triangular cross-sections. One advantageous spacing for jets 112 is three times the diameter of the jets 112, although it is contemplated that other spacings may be employed within the present principles. Placement, orientation, and size of jets 112 should be selected to maximize coolant flow and turbulence, such that heat transfer in the channels 204 is maximized.

It should be noted that channels 204 have ribs 105 on three of its four walls. Ribs 105 may be used on one, two, three, or all of the walls of channels 204, depending on the intended application, but it should be noted that having ribs on the top wall of channels 204, e.g., on the jet plate 110, will not contribute substantially to heat transfer and will increase the pressure drop across the cold plate 100. As such, having ribs 105 on the jet plate 110 may adversely affect the overall dissipative performance of the cold plate 100. Ribs 105 keep the flow in the channels 204 turbulent and increase wetted surface area. As those having skill in the art will recognize, wetted surface area refers to the surface area of the solid bulk of the walls of channels 204 that is in contact with the coolant fluid. This increase of surface area increases the rate of heat transfer even if a "dry" coolant, such as air, is used.

Ribs 105 may be formed by milling, electrical discharge machining, etching, stamping, machining, extrusion, or any other suitable technique. Although for simplicity it is specifically contemplated that the ribs will be formed from the same material as the walls of the channels 204, the ribs 105 may be formed from any appropriate material and added to the channels 204 in any appropriate fashion. Furthermore, ribs may be formed in any shape. For example, the ribs may have a triangular, rectangular, or cylindrical cross section. Furthermore, rib spacing may be adapted to the needs of the particular application and coolant and may be consistent or may vary from rib to rib.

The bottom channel plate 102 is placed into contact with a surface of a heat source (not shown). Heat is carried away from the heat source and into bottom channel plate 102 by conduction. Because imperfections in solid surfaces may decrease thermal contact and inhibit heat flow, heat transfer may be facilitated by using a substance to promote thermal contact, such as thermal paste, which conducts heat well and which makes contact between the heat source and bottom channel plate 102.

Figure 3:
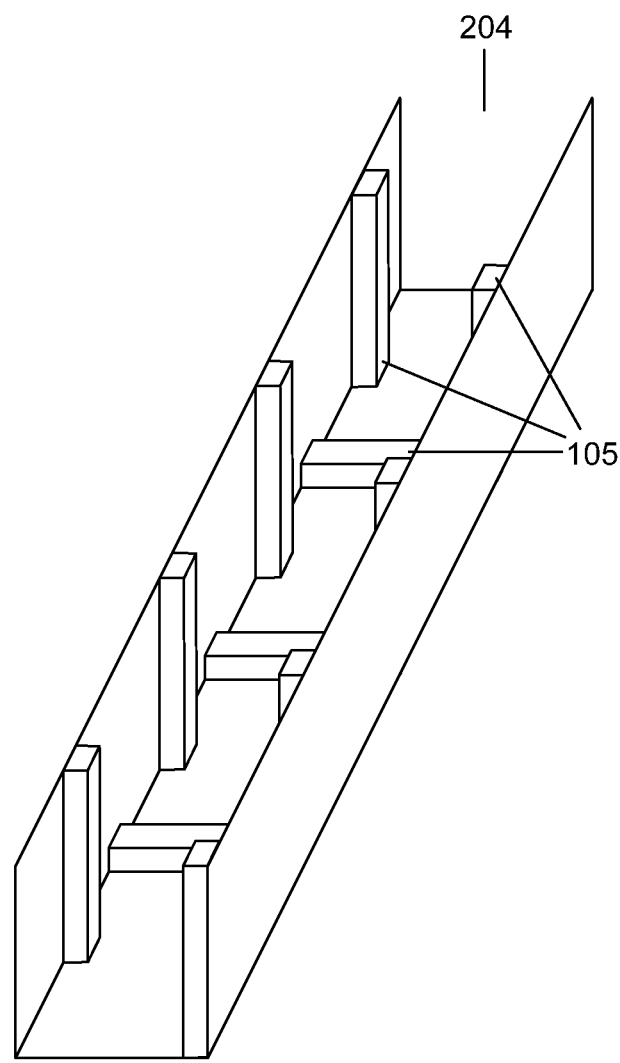
FIG. 3 is a diagram of an embodiment of a coolant channel having ribs in accordance with the present principles.

Referring now to FIG. 3 is a cutaway view of a channel 204. As can be seen, there are ribs 105 along the bottom and two sides of the channel 204, but not along the top of the channel 204. The ribs 105 are shown as being regularly spaced, though it is contemplated that the spacing between the ribs 105 may vary. One exemplary profile for the ribs 105 could have a rib height of about 10% of the channel width and a rib spacing of about 5-10 times the rib height. In addition, ribs on multiple walls of the channels 204 could be arranged in an inline or in a staggered manner.

Ribs 105 may be formed with any appropriate cross-sectional shape. In particular, rectangular cross-sections are shown in FIG. 3, but it is contemplated that other shapes, including triangles and semicircles, may be used. The ribs 105 increase coolant turbulence, and "rougher" surfaces will cause greater increases in turbulence. As such, cross-sections with sharp edges or irregularities are better suited to being used in ribs 105. It is also contemplated that ribs 105 may be formed in such a way as to produce random imperfections on the rib surface, such as machining marks, that further increase coolant flow turbulence.

Figure 4:
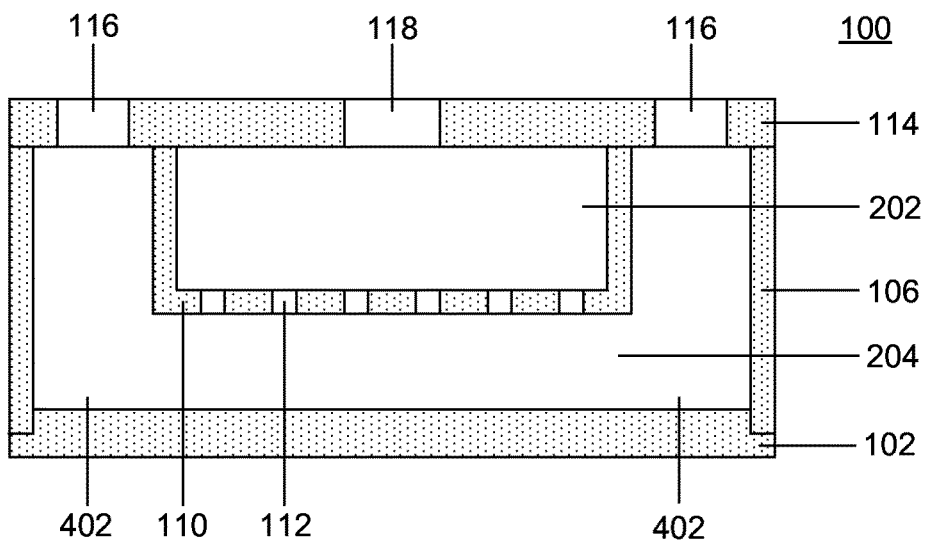
FIG. 4 is a cut-away view of an embodiment of a cooling device, providing a view along the length of the cooling channels, in accordance with the present principles.

Referring now to FIG. 4, a cutaway view of an assembled cold plate 100 is shown, viewing the length of one of the channels 204. Coolant enters by way of coolant input 118 into plenum 202. Coolant then passes through inclined impingement jets 112 into the channel 204, creating turbulent flow. The ribs 105 are not shown in this figure for the sake of simplicity. The coolant then passes through side cavities 402 and exits by the coolant outputs 116.

FIG. 4 illustrates the fit between the bottom channel plate 102 and the hollow side cover block 106.

Figure 5:
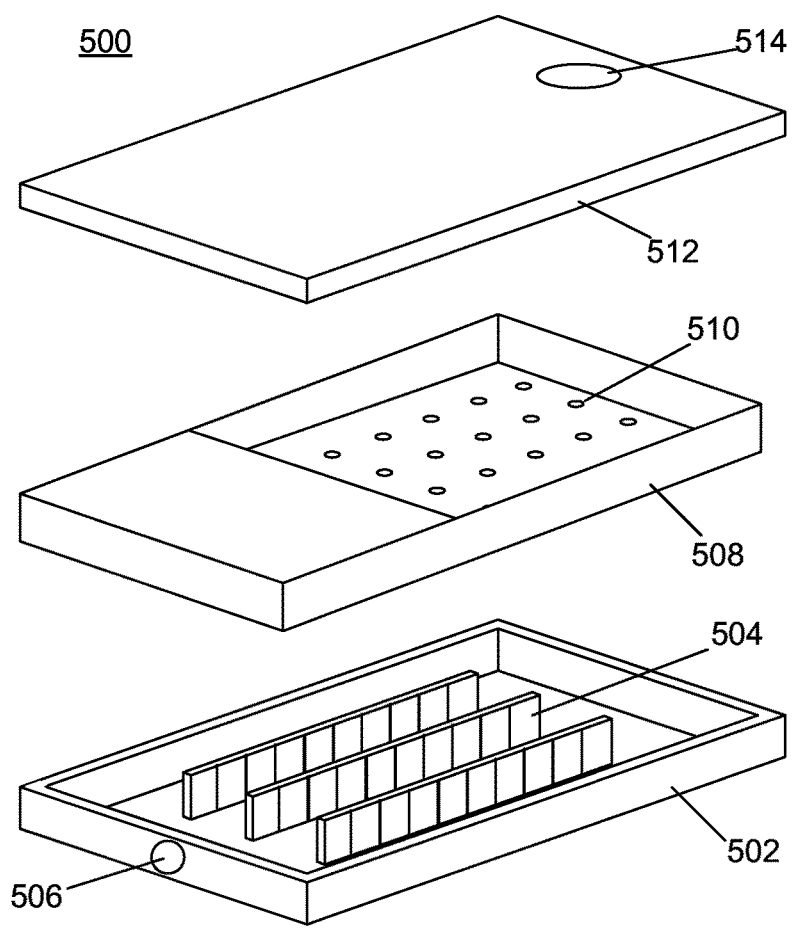
FIG. 5 is an exploded view of an alternative embodiment of a cooling device in accordance with the present principles.

Referring now to FIG. 5, an alternative embodiment of a cold plate 500 is shown. A channel plate 502 includes channel walls 504 with ribs. The channel walls 504 be milled, electrical discharge machined, etched, stamped, skived, machined, or formed through some other appropriate process. Alternatively, the channel walls 504 may be separately formed and attached to channel plate 502. Channel plate 502 includes a coolant output port 506. Although the coolant output port 506 is depicted as being disposed within a side wall of the channel plate 506, the coolant output port 506 may alternatively be disposed in a bottom surface of the channel plate 506.

A jet plate 508 is attached to the top of channel plate 502 and has a set of jets 510. As above, the jets 510 may be inclined to increase coolant turbulence and heat transfer. A cover plate 512 is placed on top of the jet plate 508 and has a coolant intake port 514. The parts can be joined to one another by any appropriate process, including brazing, soldering, and direct-bonding.

Figure 6:
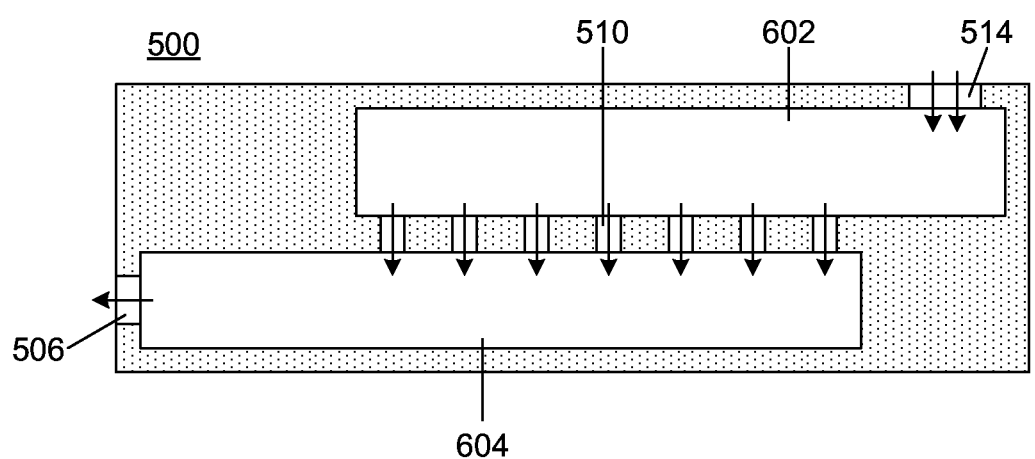
FIG. 6 is a cut-away view of an alternative embodiment of a cooling device, providing a view along the length of the cooling channels, in accordance with the present principles.

Referring now to FIG. 6, a cut-away view of cold plate 500 is shown, illustrating coolant flow. Coolant enters through intake port 514 into a plenum 602. Plenum 602 circulates coolant to the jets 510, which provide the coolant to channels 604. The channels 604 may extend along the entire length of the plenum 602 or may be shorter. In the present embodiment, the channels 604 are shorter than the full length of plenum 602, so that there are no jets 510 directly beneath the coolant intake 514. This provides greater distribution of coolant across the jets 510 along the channel. This improves the uniformity of cooling. If the coolant enters predominately at certain jets 510, the cold plate 500 directly beneath those jets 510 will receive a disproportionate amount of cooling. By placing the intake 514 over a section that does not have jets 510, the coolant is forced to circulate more uniformly through the plenum 602.

Figure 7:
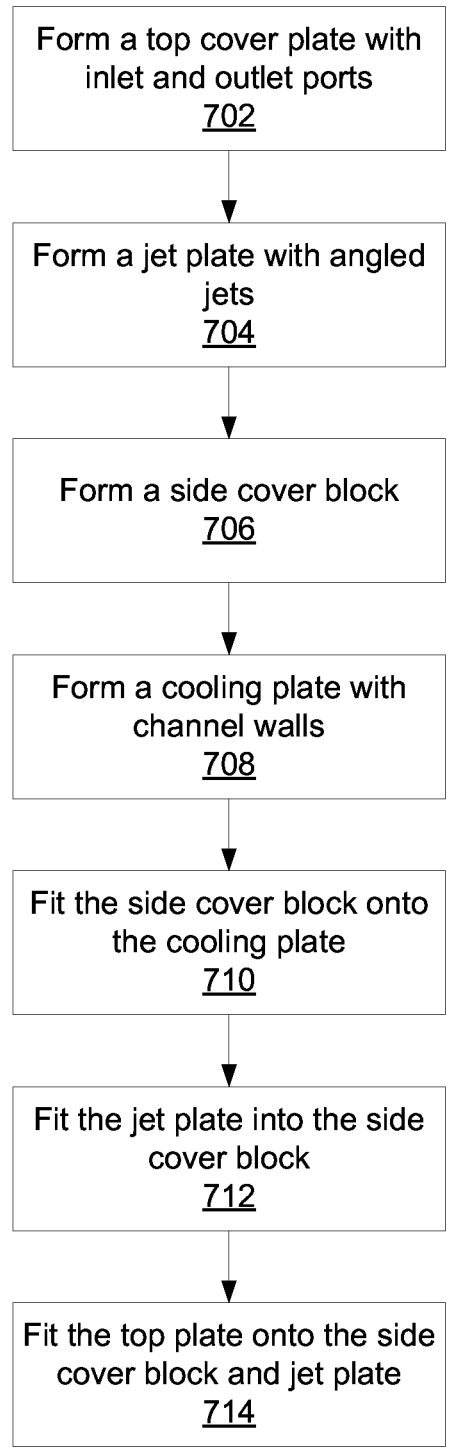
FIG. 7 is a block/flow diagram of a method for forming a cooling device according to the present principles.

Referring now to FIG. 7, a block/flow diagram is shown for forming a cooling device according to the present principles. Block 702 forms a top cover plate 114 that has at least one inlet port 118 and at least one outlet port 116. The top cover plate 114 may be formed by any appropriate process, including for example milling, electrical discharge machining, etching, stamping, and extrusion. Block 704 forms the jet plate 110 including jets 112. The jets 112 may be formed with the jet plate by the above processes, or they may be drilled into the jet plate 110. Block 706 forms side cover block 106, having guides 108 of such a size as to accommodate the jet plate 110. Block 708 forms the cooling plate 102 having channel walls 104. The channel walls 104 may be formed integrally with the cooling plate 102 by, e.g., skiving, or may be formed on a separate surface and then attached to cooling plate 102 by any appropriate method or combination of methods, including brazing, soldering, and direct-bonding.

Block 710 fits the side cover block 106 onto the cooling plate 102. The cooling plate 102 may be designed with a recessed border 103 to accommodate the side cover block 106, such that the side cover block 106 and the cooling plate 102 form a tight seal to prevent coolant leakage. Block 712 fits the jet plate 110 into the guides 108 in the side cover block 106, and block 714 first the top plate onto the side cover plate 106 and jet plate 110, forming plenum 202. The points of contact between the various pieces are joined in such a way as to prevent coolant leakage along the edges, which would diminish cooling efficiency.

Figure 8:
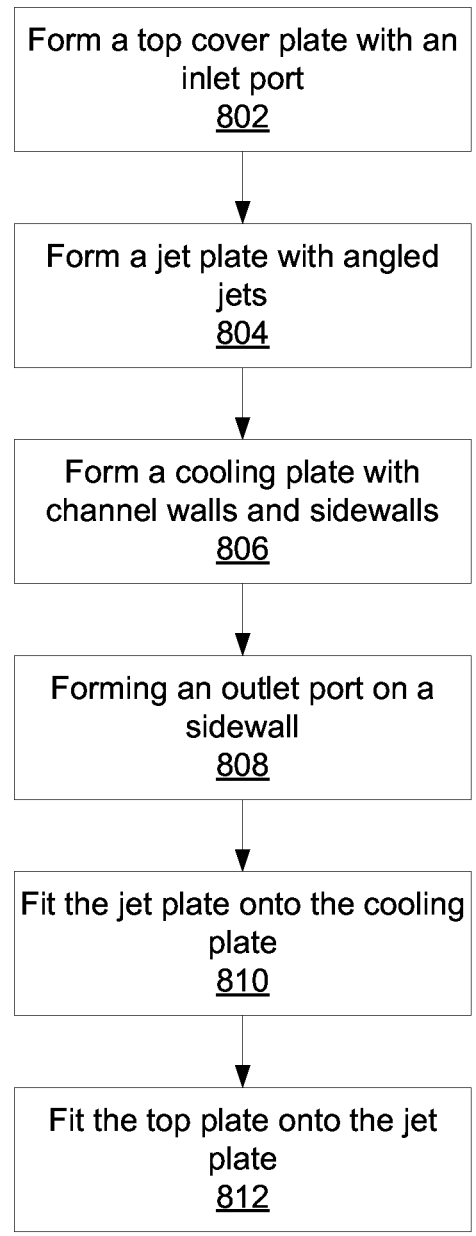
FIG. 8 is a block/flow diagram of an alternative method for forming a cooling device according to the present principles.

Referring now to FIG. 8, a block/flow diagram is shown for an alternative method of forming a cooling device according to the present principles. Block 802 forms a top cover plate 512 that has at least one inlet port 514. Again, the elements of this embodiment may be formed by any appropriate process, including for example milling, electrical discharge machining, etching, stamping, and extrusion. Block 804 forms jet plate 508 with jets 510 being formed integrally with the jet plate 508 or added afterward by machining or drilling. Block 806 forms a cooling plate 502 with channel walls 504 and sidewalls. As above, the channel walls 504 may be formed integrally with the cooling plate 502 or may be formed separately and then attached to the cooling plate 502 by, e.g., brazing, soldering, and direct-bonding.

Block 808 forms one or more outlet ports 506 in the sidewalls of cooling plate 502. The outlet port 506 may optionally also be formed integrally with the cooling plate 502 in block 806. Block 810 fits the jet plate 508 onto the cooling plate 502, and block 812 fits the top plate 512 onto the jet plate. The points of contact between the various pieces are joined in such a way as to prevent coolant leakage along the edges, which would diminish cooling efficiency.

Figure 9:
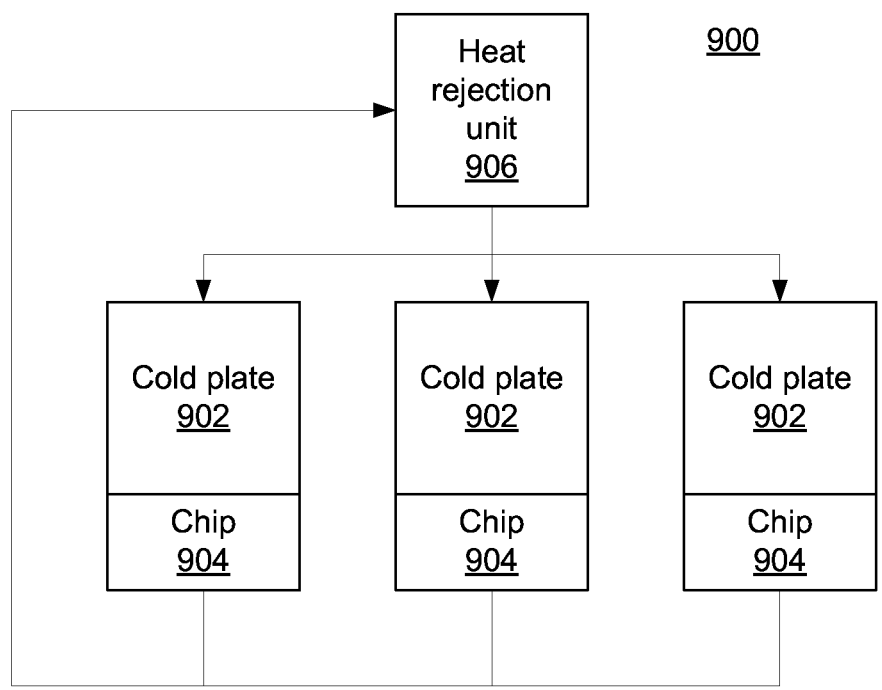
FIG. 9 is a diagram of an embodiment of a cooling in accordance with the present principles.

Referring now to FIG. 9, a diagram of an exemplary cooling system is shown. Chips 904 are shown, which generate heat during operation that must be removed. Each chip 904 has a cold plate 902 attached to it. The cold plate 902 may be attached using a thermal interface material to promote heat transfer away from the chip 904. Coolant fluid is then pumped through the cold plate 902 and circulated to a heat rejection unit 906 which removes heat from the coolant and releases it into, e.g., the environment. The coolant then returns to the cold plates 902 to be used again.

Having described preferred embodiments of a cold plate with combined inclined impingement and ribbed channels (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a heat transfer device, comprising:
   providing a top cover plate with at least one inlet port;
   providing a jet plate with a plurality of inclined jets set at an angular deviation from normal;
   providing a bottom plate with channel walls that have ribs;
   attaching the top cover plate to the jet plate to form an inlet plenum; and
   attaching the jet plate to the bottom plate to form a plurality of ribbed channels, wherein the ribs are oriented perpendicular to a long dimension of the plurality of ribbed channels and wherein the angular deviation of each inclined jet establishes a jet direction perpendicular to a long dimension of the plurality of ribbed channels.

2. The method of claim 1, further comprising forming one or more outlet ports in the top cover plate.

3. The method of claim 1, further comprising forming one or more outlet ports in a sidewall of the bottom plate.

4. The method of claim 1, further comprising:
   forming a side cover block; and
   attaching the jet plate to the side cover block.

5. A method for forming a heat transfer device, comprising:
   forming a top cover plate with at least one inlet port;
   providing a jet plate with a plurality of inclined jets set at an angular deviation from normal;
   providing a bottom plate with channel walls that have ribs;
   attaching the top cover plate to the jet plate to form an inlet plenum; and
   attaching the jet plate to the bottom plate to form a plurality of ribbed channels, such that the angular deviation of each inclined jet establishes a jet direction perpendicular to a long dimension of the plurality of ribbed channels.

6. The method of claim 1, further comprising forming one or more outlet ports in the top cover plate.

7. The method of claim 1, further comprising forming one or more outlet ports in a sidewall of the bottom plate.

8. The method of claim 1, further comprising:
   forming a side cover block; and
   attaching the jet plate to the side cover block.

9. The method of claim 1, wherein each ribbed channel has ribs on only three of four channel walls.

10. The method of claim 5, wherein each ribbed channel has ribs on only three of four channel walls.

11. The method of claim 4, wherein attaching the jet plate to the side cover block comprises a joining process selected from the group consisting of brazing, soldering, and direct-bonding.

12. The method of claim 8, wherein attaching the jet plate to the side cover block comprises a joining process selected from the group consisting of brazing, soldering, and direct-bonding.

13. The method of claim 1, wherein the jet plate is formed with a material with a lower thermal conductivity than a material of the bottom plate.

14. The method of claim 5, wherein the jet plate is formed with a material with a lower thermal conductivity than a material of the bottom plate.

15. The method of claim 1, wherein plurality of inclined jets comprises a respective plurality of inclined jets for each of the plurality of ribbed channels.

16. The method of claim 15, wherein each respective plurality of inclined jets has a spacing between inclined jets of about three times a diameter of the inclined jets.

* * * * *